(12) United States Patent
Micheloni et al.

(10) Patent No.: US 9,454,414 B2
(45) Date of Patent: Sep. 27, 2016

(54) SYSTEM AND METHOD FOR ACCUMULATING SOFT INFORMATION IN LDPC DECODING

(71) Applicant: Microsemi Storage Solutions (US), Inc., Aliso Viejo, CA (US)

(72) Inventors: Rino Micheloni, Turate (IT); Alessia Marelli, Dalmine (IT); Peter Z. Onufryk, Flanders, NJ (US); Christopher I. W. Norrie, San Jose, CA (US); Ihab Jaser, San Jose, CA (US); Luca Crippa, Busnago (IT)

(73) Assignee: Microsemi Storage Solutions (US), Inc., Aliso Viejo, CA (US)

( * ) Notice: Subject to any disclaimer, the term of this patent is extended or adjusted under 35 U.S.C. 154(b) by 44 days.

(21) Appl. No.: 14/210,971

(22) Filed: Mar. 14, 2014

(65) Prior Publication Data

US 2014/0281828 A1 Sep. 18, 2014

Related U.S. Application Data

(60) Provisional application No. 61/794,750, filed on Mar. 15, 2013.

(51) Int. Cl.

| H03M 13/11 | (2006.01) |
|---|---|
| H03M 13/00 | (2006.01) |
| G06F 11/00 | (2006.01) |
| G06F 11/10 | (2006.01) |
| H03M 13/37 | (2006.01) |

(52) U.S. Cl.
CPC ............ *G06F 11/00* (2013.01); *G06F 11/1048* (2013.01); *H03M 13/3769* (2013.01); *H03M 13/1111* (2013.01)

(58) Field of Classification Search
None
See application file for complete search history.

(56) References Cited

U.S. PATENT DOCUMENTS

| 5,615,235 | A | 3/1997 | Kakuishi et al. |
|---|---|---|---|
| 5,732,092 | A | 3/1998 | Shinohara |
| 6,115,788 | A | 9/2000 | Thowe |
| 6,539,515 | B1 | 3/2003 | Gong |
| 6,633,856 | B2 | 10/2003 | Richardson et al. |
| 6,725,409 | B1 | 4/2004 | Wolf |
| 6,789,227 | B2 | 9/2004 | De Souza et al. |
| 6,895,547 | B2 | 5/2005 | Eleftheriou et al. |
| 6,934,804 | B2 | 8/2005 | Hashemi |
| 6,976,194 | B2 | 12/2005 | Cypher |
| 6,976,197 | B2 | 12/2005 | Faust et al. |
| 7,116,732 | B2 | 10/2006 | Worm et al. |
| 7,206,992 | B2 | 4/2007 | Xin |
| 7,209,527 | B2 | 4/2007 | Smith et al. |
| 7,237,183 | B2 | 6/2007 | Xin |
| 7,324,559 | B2 | 1/2008 | McGibney |
| 7,450,668 | B2 | 11/2008 | Ghosh et al. |
| 7,457,906 | B2 | 11/2008 | Pettey et al. |

(Continued)

*Primary Examiner* — Justin R Knapp
(74) *Attorney, Agent, or Firm* — Glass & Associates; Kenneth Glass

(57) ABSTRACT

A system and method reading, accumulating and processing soft information for use in LDPC decoding. In accordance with the present invention, an LDPC decoder includes accumulation circuitry to receive soft reads of a cell of the nonvolatile memory storage module and to produce an accumulated soft read that can be used to identify an appropriate LLR for the cell. The accumulation circuitry of the present invention may include, an accumulation RAM, an arithmetic logic unit (ALU) and a soft accumulation control and sequencing module for accumulating and processing soft information for use in LDPC decoding.

20 Claims, 16 Drawing Sheets

(56) References Cited

U.S. PATENT DOCUMENTS

| | | |
|---|---|---|
| 7,472,331 B2 | 12/2008 | Kim et al. |
| 7,484,158 B2 | 1/2009 | Sharon et al. |
| 7,529,215 B2 | 5/2009 | Osterling |
| 7,567,472 B2 | 7/2009 | Gatzemeier et al. |
| 7,694,047 B1 | 4/2010 | Alston |
| 7,739,472 B2 | 6/2010 | Guterman et al. |
| 7,752,346 B2 | 7/2010 | Talayco et al. |
| 7,801,233 B1 | 9/2010 | Chow et al. |
| 7,904,793 B2 | 3/2011 | Mokhlesi et al. |
| 7,937,641 B2 | 5/2011 | Amidi |
| 7,945,721 B1 | 5/2011 | Johnsen et al. |
| 7,958,430 B1 | 6/2011 | Kolokowsky et al. |
| 7,975,193 B2 | 7/2011 | Johnson |
| 8,094,508 B2 | 1/2012 | Gatzemeier et al. |
| 8,140,930 B1 | 3/2012 | Mauro |
| 8,176,367 B2 | 5/2012 | Dreifus et al. |
| 8,219,894 B2 | 7/2012 | Au et al. |
| 8,223,745 B2 | 7/2012 | Johnsen et al. |
| 8,228,728 B1 | 7/2012 | Yang |
| 8,245,112 B2 | 8/2012 | Hicken et al. |
| 8,245,117 B1 | 8/2012 | Wu |
| 8,250,286 B2 | 8/2012 | Yeh et al. |
| 8,254,112 B2 | 8/2012 | Yang et al. |
| 8,255,770 B2 | 8/2012 | Park et al. |
| 8,259,498 B2 | 9/2012 | Yogev et al. |
| 8,261,136 B2 | 9/2012 | D'abreu et al. |
| 8,281,227 B2 | 10/2012 | Thatcher et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 | 12/2012 | Weingarten et al. |
| 8,341,502 B2 | 12/2012 | Steiner et al. |
| 8,359,522 B2 | 1/2013 | Gunnam et al. |
| 8,392,789 B2 | 3/2013 | Biscondi et al. |
| 8,402,201 B2 | 3/2013 | Flynn et al. |
| 8,418,023 B2 | 4/2013 | Gunnam et al. |
| 8,429,325 B1 | 4/2013 | Onufryk et al. |
| 8,429,497 B2 | 4/2013 | Tu et al. |
| 8,493,791 B2 | 7/2013 | Karakulak et al. |
| 8,504,885 B2 | 8/2013 | Haratsch et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,640,005 B2 | 1/2014 | Wilkerson et al. |
| 8,645,613 B2 | 2/2014 | Tan et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,739,008 B2 | 5/2014 | Liu et al. |
| 8,775,913 B2 | 7/2014 | Haratsch et al. |
| 8,898,372 B2 | 11/2014 | Yeh |
| 8,917,734 B1 | 12/2014 | Brown |
| 8,924,824 B1 | 12/2014 | Lu |
| 8,958,247 B2 | 2/2015 | Asaoka et al. |
| 8,995,302 B1 | 3/2015 | Brown et al. |
| 9,025,495 B1 | 5/2015 | Onufryk et al. |
| 9,058,289 B2 | 6/2015 | Tai et al. |
| 9,294,132 B1 | 3/2016 | Peleato-Inarrea |
| 2002/0051501 A1 | 5/2002 | Demjanenko et al. |
| 2002/0181438 A1 | 12/2002 | McGibney |
| 2003/0033567 A1 | 2/2003 | Tamura et al. |
| 2003/0104788 A1 | 6/2003 | Kim |
| 2003/0225970 A1 | 12/2003 | Hashemi |
| 2004/0088636 A1 | 5/2004 | Cypher |
| 2004/0123230 A1 | 6/2004 | Lee et al. |
| 2004/0234150 A1 | 11/2004 | Chang |
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0286511 A1 | 12/2005 | Johnsen et al. |
| 2006/0039370 A1 | 2/2006 | Rosen et al. |
| 2006/0126728 A1 | 6/2006 | Yu et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0136628 A1 | 6/2007 | Doi et al. |
| 2007/0147489 A1 | 6/2007 | Sun et al. |
| 2007/0233939 A1 | 10/2007 | Kim |
| 2008/0005382 A1 | 1/2008 | Mimatsu |
| 2008/0016425 A1 | 1/2008 | Khan et al. |
| 2008/0229079 A1 | 9/2008 | Flynn et al. |
| 2008/0229164 A1 | 9/2008 | Tamura et al. |
| 2008/0256292 A1 | 10/2008 | Flynn et al. |
| 2008/0267081 A1 | 10/2008 | Roeck |
| 2008/0276156 A1 | 11/2008 | Gunnam et al. |
| 2009/0067320 A1 | 3/2009 | Rosenberg et al. |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar |
| 2009/0327802 A1 | 12/2009 | Fukutomi |
| 2010/0085076 A1 | 4/2010 | Danilin |
| 2010/0162075 A1 | 6/2010 | Brannstrom et al. |
| 2010/0199149 A1 | 8/2010 | Weingarten |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0293440 A1 | 11/2010 | Thatcher |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0209031 A1 | 8/2011 | Kim et al. |
| 2011/0225341 A1 | 9/2011 | Satoh et al. |
| 2011/0246136 A1 | 10/2011 | Haratsch |
| 2011/0246842 A1 | 10/2011 | Haratsch |
| 2011/0246853 A1 | 10/2011 | Kim |
| 2011/0296084 A1 | 12/2011 | Nango |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0141139 A1 | 6/2012 | Bakhru et al. |
| 2012/0166690 A1 | 6/2012 | Regula |
| 2012/0311402 A1 | 12/2012 | Tseng et al. |
| 2013/0013983 A1 | 1/2013 | Livshitz et al. |
| 2013/0086451 A1 | 4/2013 | Grube et al. |
| 2013/0117616 A1 | 5/2013 | Tai et al. |
| 2013/0117640 A1 | 5/2013 | Tai et al. |
| 2013/0145235 A1 | 6/2013 | Aussien et al. |
| 2013/0163327 A1 | 6/2013 | Karakulak et al. |
| 2013/0163328 A1 | 6/2013 | Karakulak et al. |
| 2013/0176779 A1 | 7/2013 | Chen |
| 2013/0185598 A1 | 7/2013 | Haratsch |
| 2013/0315252 A1 | 11/2013 | Emmadi et al. |
| 2013/0318422 A1 | 11/2013 | Weathers et al. |
| 2014/0040704 A1 | 2/2014 | WU et al. |
| 2014/0053037 A1 | 2/2014 | Wang et al. |
| 2014/0068368 A1 | 3/2014 | Zhang et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0181617 A1 | 6/2014 | Wu et al. |
| 2014/0185611 A1 | 7/2014 | Lie et al. |
| 2014/0198581 A1 | 7/2014 | Kim et al. |
| 2014/0281767 A1 | 9/2014 | Alhussien et al. |
| 2014/0281822 A1* | 9/2014 | Wu ............... G06F 11/1068 714/773 |
| 2014/0281823 A1 | 9/2014 | Micheloni et al. |
| 2015/0149871 A1 | 5/2015 | Chen et al. |
| 2015/0186055 A1 | 7/2015 | Darragh |

\* cited by examiner

| PATTERN TABLE | | | | | | | |
|---|---|---|---|---|---|---|---|
| YU | YD | XL | XR | XY1 | XY2 | XY3 | XY4 |
| 1 | 1 | 1 | 1 | 1 | 1 | 1 | 1 |
| 1 | 1 | 1 | 1 | 1 | 1 | 1 | 0 |
| 1 | 1 | 1 | 1 | 1 | 1 | 0 | 1 |
| 1 | 1 | 1 | 1 | 1 | 1 | 0 | 0 |
| 1 | 1 | 1 | 1 | 1 | 0 | 1 | 1 |
| 1 | 1 | 1 | 1 | 1 | 0 | 1 | 0 |
| 1 | 1 | 1 | 1 | 1 | 0 | 0 | 1 |
| 1 | 1 | 1 | 1 | 1 | 0 | 0 | 0 |
| 1 | 1 | 1 | 1 | 0 | 1 | 1 | 1 |
| 1 | 1 | 1 | 1 | 0 | 1 | 1 | 0 |
| . . . | | | | | | | |
| 0 | 0 | 0 | 0 | 0 | 0 | 1 | 0 |
| 0 | 0 | 0 | 0 | 0 | 0 | 0 | 1 |
| 0 | 0 | 0 | 0 | 0 | 0 | 0 | 0 |

SYSTEM AND METHOD FOR ACCUMULATING SOFT INFORMATION IN LDPC DECODING

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code employed in nonvolatile memory storage modules, such as SSDs, are low-density parity-check (LDPC) codes. An LDPC code is a linear error correcting code having a parity check matrix with a small number of nonzero elements in each row and column. Various methods for decoding data encoded with LDPC error correction codes are known in the art. One commonly employed decoding method for LDPC coding is the layered min-sum algorithm (MSA). While the min-sum algorithm is an approximation of the quasi-optimal decoding method of belief propagation, the layered min-sum algorithm introduces a further hardware simplification. The layered min-sum algorithm is iterative by layer and is based on belief propagation. The layered min-sum algorithm (MSA) is less complex than other decoding methods known in the art. However, the min-sum algorithm exhibits a noticeable degradation in the decoding performance compared to the more complex decoding methods, such as belief propagation. To counteract the degradation in the decoding performance achievable with the layered min-sum algorithm, normalized layered min-sum algorithms with have been developed incorporating a normalization factor, or attenuation factor, to account for the degradation in decoding performance.

The power of LDPC codes resides in the ability of the decoding strategy to exploit the soft information on the stored data. In LDPC decoding, the two voltage distributions represent the two possible states: "0" and "1", of the cells within the NAND chips. Soft information for the stored data is expressed by a log likelihood ratio (LLR). The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. The sign of the LLR typically provides the bit estimation (i.e. positive LLR corresponds to 0 and negative LLR corresponds to 1). The magnitude of the LLR provides the reliability of the estimation (i.e. $|LLR|=0$ means that the estimation is completely unreliable and $|LLR|=\infty$ means that the estimation is completely reliable and the bit value is known.

Soft information is essential to improving the quality of the LLRs used in the LDPC decoding process. However, when the soft information is acquired from a variety of sources, an efficient method of accumulating the soft information is necessary.

Accordingly, what is needed in the art is an efficient method of acquiring, accumulating and processing soft information for use in LDPC decoding.

SUMMARY

In various embodiments, a nonvolatile memory system includes a nonvolatile memory storage module for storing encoded data. The encoded data stored in the nonvolatile memory storage module is encoded using a low-density parity check (LDPC) error correction code. A decoder receives the LDPC encoded data stored in the nonvolatile memory storage module and attempts to decode and recover the data.

A nonvolatile memory storage controller is provided for delivering log likelihood ratios (LLRs) to a low-density parity check (LDPC) decoder for use in the decoding of an LDPC encoded codeword.

A method of accumulating soft information of a nonvolatile memory storage module for use in LDPC (Low-Density Party Check) decoding of a codeword stored in the nonvolatile memory storage module is provided. The method includes, performing one or more reads of a cell of a nonvolatile memory storage module to generate one or more soft reads associated with a bit stored in the cell. After the one or more soft reads have been generated, the method continues by accumulating the one or more soft reads to generate an accumulated soft read associated with the bit stored in the cell and converting the accumulated soft read into a log-likelihood ratio (LLR) for use in LDPC decoding of a codeword stored in the nonvolatile memory storage module.

The one or more reads of the cell may be performed at one or more different reference voltages. Additionally, the one or more reads of the cell may be compressed prior to being accumulated to generate an accumulated soft read. The one or more reads may include one or more reads of the neighboring cells of the cell being read.

A nonvolatile memory controller for accumulating soft information of a nonvolatile memory storage module for use in LDPC (Low-Density Parity Check) decoding of a codeword stored in the nonvolatile memory storage module is provided. The controller includes read circuitry configured for performing one or more reads of a cell of a nonvolatile memory storage module to generate one or more soft reads associated with a bit stored in the cell, accumulation circuitry coupled to the read circuitry, the accumulation circuitry configured for accumulating the one or more soft reads to generate an accumulated soft read associated with the bit stored in the cell and look-up circuitry coupled to the accumulation circuitry, the look-up circuitry configured for converting the accumulated soft read into a log-likelihood ratio (LLR) for use in LDPC decoding of a codeword stored in the nonvolatile memory storage module.

A system for accumulating soft information for use in LDPC (Low-Density Parity Check) decoding is provided. The system includes a nonvolatile memory storage module storing a codeword, read circuitry coupled to the nonvolatile memory storage module, the read circuitry configured for performing one or more reads of a cell of the nonvolatile memory storage module to generate one or more soft reads associated with a bit stored in the cell, accumulation circuitry coupled to the read circuitry, the accumulation circuitry configured for accumulating the one or more soft reads to generate an accumulated soft read associated with the bit stored in the cell and look-up circuitry coupled to the accumulation circuitry, the look-up circuitry for converting the accumulated soft read into a log-likelihood ratio (LLR) for use in LDPC decoding of the codeword stored in the nonvolatile memory storage module.

Accordingly, the system and method of the present invention provides an efficient method of acquiring, accumulating and processing soft information for use in LDPC decoding.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 11 is an illustration of a pattern table, BER table and LLR table in accordance with an embodiment of the present invention.

DETAILED DESCRIPTION

In the operation of a stored channel utilizing LDPC encoding, original data is stored in a nonvolatile memory system. Different noise sources, estimated as a White Gaussian Noise (AWGN) Channel, corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

Figure 1:
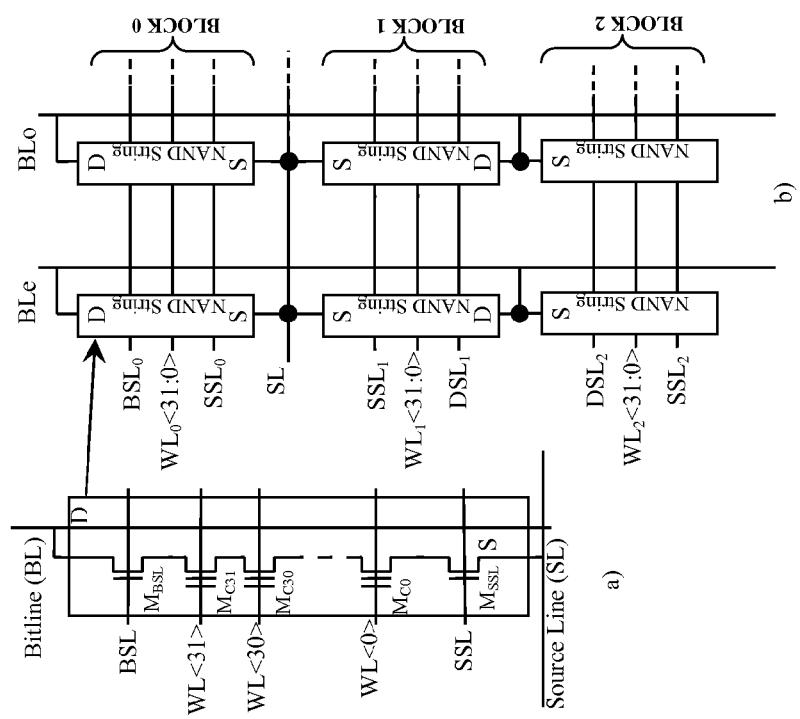
FIG. 1 is circuit diagram illustrating a NAND string and a NAND array architecture.

The nonvolatile memory system may be a NAND-based flash memory system. NAND flash memories are nonvolatile, and as such, are able to store and keep data even in the absence of a power source. With reference to FIG. 1, the basic elements of a flash memory are the nonvolatile memory cells, which are usually connected in series to form a string. Typically a string is composed of 32 or 64 cells in series. FIG. 1(a) illustrates the case wherein 32 cells ($M_{C0}$ to $MC_{31}$) are connected in series. Two selection transistors are placed at the edge of the string of cells. Selection transistor $M_{SSL}$ ensures the connection to the source line, while selection transistor $M_{BSL}$ connects the string to the bitline (BL). The control gates of the cells are connected through the wordlines (WLs). FIG. 1(b) illustrates how the matrix array of cells is built, beginning with a string. In the WL direction, adjacent NAND strings share the same WL, DSL, BSL and SL. In the BL direction, two consecutive strings share the BL contain NAND based memories, a flash block is composed of the NAND strings that share the same group of WLs. FIG. 1(b) illustrates three blocks: BLOCK0 is made up of $WL_0$<31:0>, BLOCK1 is made up of $WL_1$<31:0> and BLOCK2 is made up of $WL_2$<31:0>.

In NAND based memories, a logical page is composed of cells belonging to the same WL. The number of pages per WL is related to the storage capability of the memory cell. Depending upon the number of storage levels, flash memories are referred to in different ways: SLC (single level cell) memories store 1 bit per cell, MLC (multi-level cell) memories store 2 bits per cell, 8LC (eight level cell or triple level cell) memories store 3 bits per cell and 16LC (sixteen level cell) memories store 4 bits per cell.

Considering the SLC case with interleaved architecture, wherein one page is composed of even cells and a second page is composed of odd cells, as shown in FIG. 1(b), if the page size is 4 kB, it follows that a WL has 32,768+32,768=65,536 cells. In contrast, in the MLC case, there are four pages, as each cell stores one least significant bit (LSB) and one most significant bit (MSB).

In general, a logical page is the smallest addressable unit for reading from and writing to the NAND memory. The number of logical pages within a logical block is typically a multiple of 16 (e.g. 64, 128). Additionally, in a NAND based memory, a logical block is the smallest erasable unit.

Figure 2:
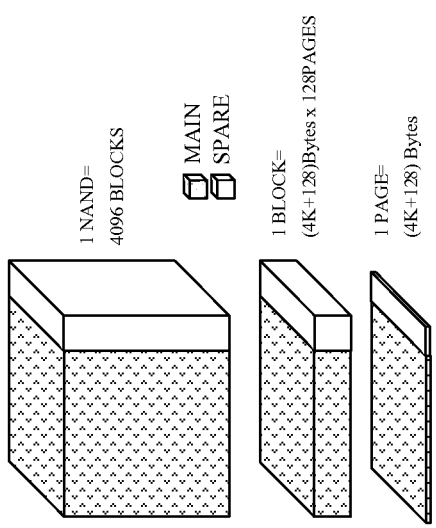
FIG. 2 is an illustration of a 16 GBit memory logic organization.

As shown with reference to FIG. 2, each page of the NAND memory is composed of a main data area and a spare area. The main area may have the size of 4 kB, 8 kB or 16 kB. The spare area can be used to store error correction codes (ECC) and is made up of hundreds of bytes for every 4 kB of main data area.

FIG. 2 illustrates the logical organization of an SLC device with a string of 64 cells, interleaving architecture and 4 kB page (plus 128 B of spare area per page). Each logical block contains 128 pages with a total of 512 kB per block. It follows that for a 4 GB (16 Gbit) memory, 4096 block are needed for storage.

While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column.

LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired. Well-designed LDPC codes have an UBER very near the Shannon limit.

Figure 3:
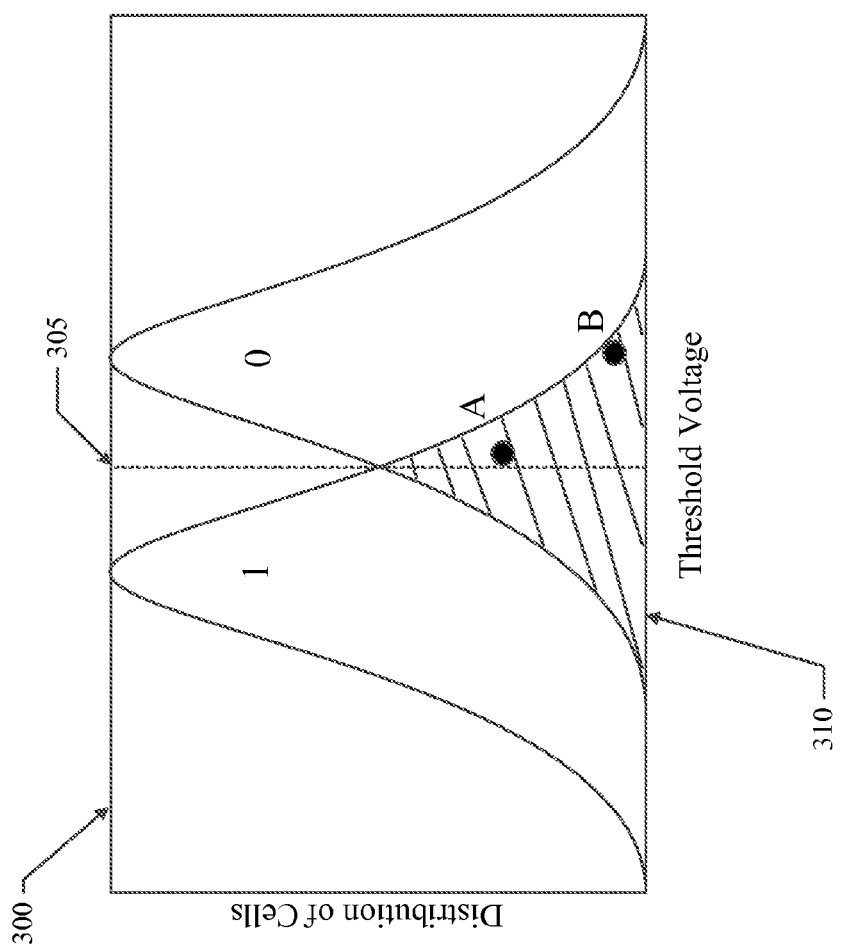
FIG. 3 is a graphical illustration of a single level cell distribution in a NAND cell.

The power of LDPC codes resides in the ability of the decoding strategy to exploit the soft information on the stored data. In LDPC decoding, the two voltage distributions represent the two possible states: "0" and "1", of the cells within the NAND chips. When the voltage distributions overlap 310, as shown with reference to the graph 300 of FIG. 3, errors arise. A hard decision decoder will read all the positive values as 0 and all the negative values as 1. So, in the situation depicted in the graph 300, the overlap region 310 will be composed of read errors. However, observing error points A and B within the overlap region 310, it is clear that the error points may vary in magnitude. For example, point A is slightly positive, while point B is farther away from the threshold voltage 305. As such, point A is more likely to be in error than point B. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log likelihood ratio (LLR). The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. The sign of the LLR typically provides the bit estimation (i.e. positive LLR corresponds to 0 and negative LLR corresponds to 1). The magnitude of the LLR provides the reliability of the estimation (i.e. $|LLR|=0$ means that the estimation is completely unreliable and $|LLR|=\infty$ means that the estimation is completely reliable and the bit value is known. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

To perform a successful read operation on the NAND-based flash memory device employing LDPC encoding, a plurality of read operations are performed at various read reference voltage levels, by applying the read reference voltage to the corresponding control gate of the cell to see if the sensed cell conducts at that particular read reference voltage. The responses of the cell for each of the read reference voltages are then used to determine the value of the bit stored by the cell. The conventional design practice is to employ uniform distribution for sensing the cells, wherein the soft-decision reference voltages are uniformly distributed between two consecutive hard-decision reference voltages. However, since the area where most errors will occur is in the overlap of the threshold voltage distributions, and since most of the overlap between two adjacent states occurs in the vicinity of the corresponding hard-decision reference voltages, the present invention employs non-uniform partitioning of the threshold voltage distribution to improve the quality of the soft information. As such, by concentrating the soft-decision reference voltages around the hard-decision reference voltages and within the overlap regions, the same number of sensing voltages can be used in a non-uniform way to provide better information for determining the bit value.

Figure 4:
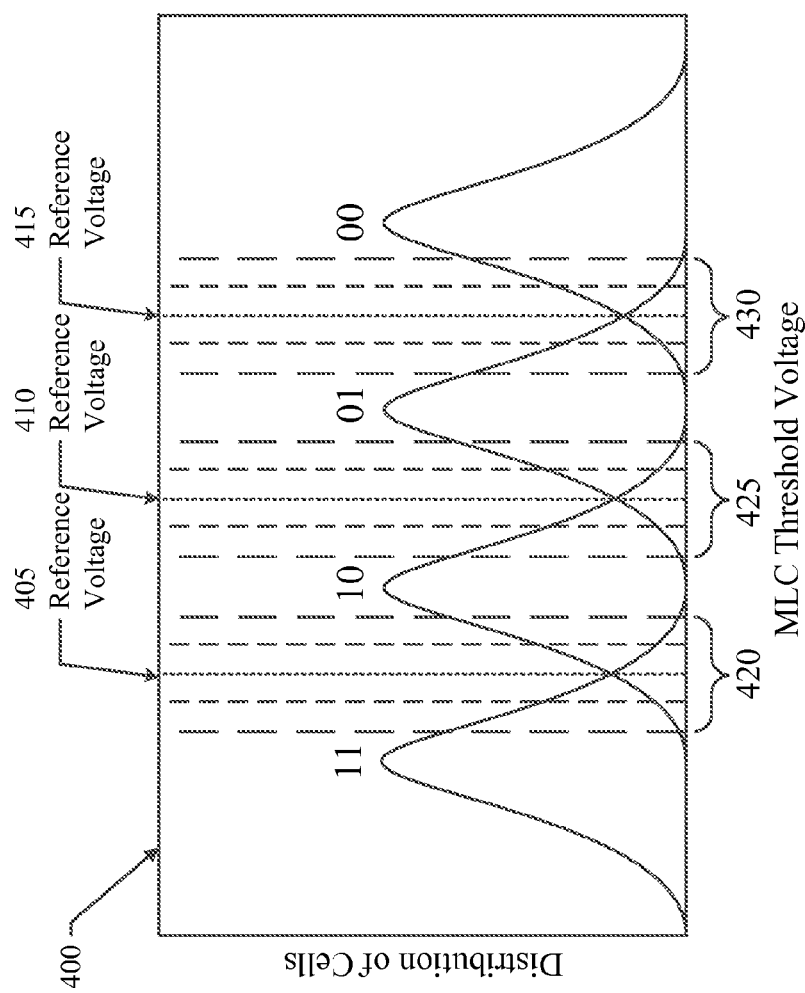
FIG. 4 is a graphical illustration of a possible threshold voltage distribution for a multi-level cell and the corresponding read reference voltages.

As shown with reference to FIG. 4, in accordance with an embodiment of the present invention, non-uniform threshold voltage sensing is performed for an MLC cell, wherein the overlap regions 420, 425 and 430 are defined around each of the hard-decision reference voltages 405, 410 and 415 and uniform memory sensing is performed within each of the overlap regions using the plurality of soft-decision reference voltages. In the case of an MLC flash memory, the overlap regions of the threshold voltage distributions for the flash memory cells are divided into a number of partitions, on either side of the hard-decision reference voltage, by moving the read reference voltages. In order to locate each bit without error, more read operations at these soft-decision reference voltages are required. As shown in the graph 400 of FIG. 4, in a specific embodiment, each overlap region 420, 425 and 430 is divided into four partitions, so that each bit (LSB and MSB) is read utilizing 3 bits, where 3 represents the number of soft-decision bits.

As previously described, for LDPC decoding, the log likelihood ratio (LLR) of the received data bits in the codeword is used to decode the codeword. As such, after each bit position is measured and the 3-bit soft-decision data has been identified, the proper LLR associated with the soft-decision bits is extracted from a look-up table stored in the flash controller and the LLR is then fed to the LDPC decoder for subsequent decoding of the codeword. In the exemplary embodiment shown in FIG. 4, 3 soft-decision bits are used to identify up to eight regions, therefore eight LLRs will be extracted from the look-up table to perform the LDPC decoding process. Additionally, every overlap region requires an LLR look-up table, so that in the MLC case illustrated in FIG. 4, three LLR look-up tables are needed to provide the necessary decoding information.

In an alternative embodiment, a single soft-decision reference voltage may be used instead of a plurality of soft-decision references voltages, resulting in only two soft-decision bits. In this embodiment, the soft-decision decoding may be considered hard-decision decoding resulting in a two-state result and therefore, two corresponding LLRs. As with the soft-decision LLRs, these hard-decision LLRs will also change over the lifetime of the device.

LLRs are a function of the shape and location of the threshold voltage distribution for the flash cells and can be computed or measured in a characterization laboratory. In order to provide the LDPC decoder with the correct soft-decision information, the LLR look-up tables used for decoding must represent the channel and the BER at that specific point in the lifetime of the flash memory. The threshold voltage distribution for the flash cells changes over the lifetime of the device due to wear-out and as such, the LLRs also change. As such, in order to provide the correct soft-decision information over the lifetime of the flash memory, a plurality of LLR tables are needed that accurately reflect the threshold voltage distributions at various points over the lifetime of the device. For example, a first LLR look-up table would be used for a fresh device, having a BER of around $10^{-6}$ and a second LLR look-up table would be used for the device towards the end of the device lifetime, when the BER is around $10^{-2}$. By utilizing LLR look-up tables that are reflective of the current point in the lifetime of the device, the LLR look-up table will most accurately represent the noise and the LDPC will perform in a quasi-optimal way.

Each flash technology exhibits a unique threshold voltage distribution over its lifetime. As such, a generic law does not exist for determining standard LLR look-up table values for the variety of flash devices available in the market. Instead, in order to characterize the flash device and thereby determine the appropriate lifetime LLR look-up table values, it is necessary to measure billions and billions of flash cell distributions over the lifetime of each flash device to understand how the flash cells will perform. The lifetime threshold voltage distribution will differ among technologies and among vendors. For example, it may be determined that a different LLR look-up table for every decade of BER accurately reflects the behavior of the flash cells over the lifetime of the device. As such, when the BER of the flash device changes from $10^{-5}$ to $10^{-4}$ a different LLR look-up table will be accessed in the flash controller to reflect this characterized change in BER. Additionally, at any single point in time, there may be multiple flash chips of the flash device operating at different points in their lifetime, or perhaps a single flash chip comprising regions that are operating at different points in their lifetime. By performing characterization of the flash device, either by computational techniques and laboratory measurements, a plurality of lifetime LLR look-up tables can be generated for the flash device that accurately reflect the change in the threshold voltage distribution of the flash device over its lifetime. The LLR look-up tables may also reflect changes to specific flash chips of the flash device or specific regions of a flash chip over the lifetime of the device. The plurality of LLR look-up tables are stored in the flash memory controller and in operation, the flash memory controller selects the appropriate LLR look-up table to use for decoding the codeword based upon the present point in the lifetime of the device.

Figure 5:
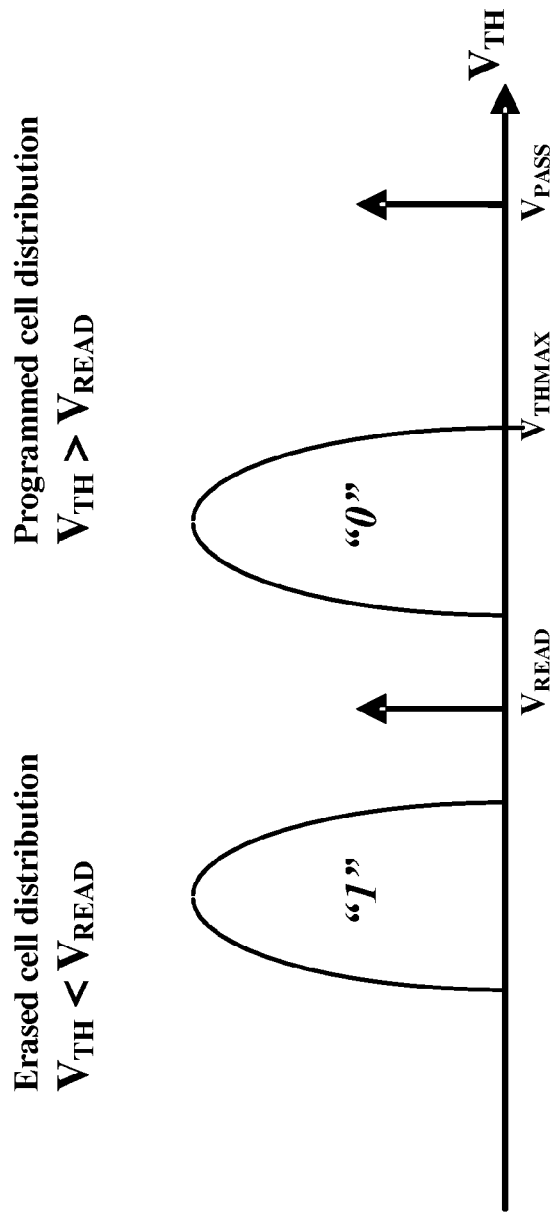
FIG. 5 is a graphical illustration of an ideal distribution level for an SLC device.

FIG. 5 illustrates an ideal distribution level for an SLC device, wherein $V_{READ}$ is the voltage level used during the read operation of the device. As shown, if the cell has a threshold voltage of less than $V_{READ}$ it is a "1" and if the cell has a threshold voltage higher than $V_{READ}$ it is a "0". However, the ideal distribution of a SLC device is influenced by the data programmed into the adjoining cells in the device. One of the largest contributing factors affecting the distribution width is the cell-to-cell floating gate coupling.

Figure 6:
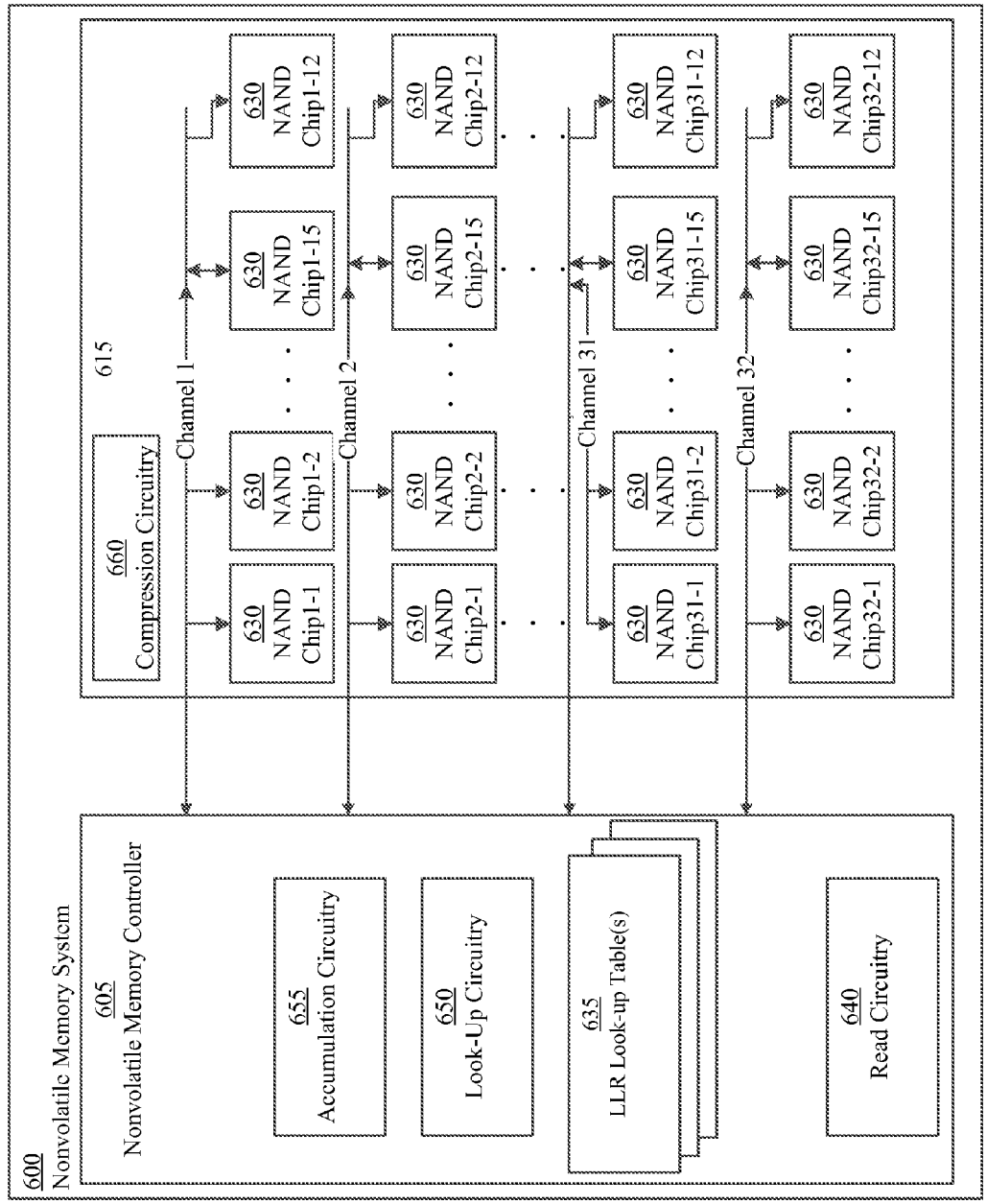
FIG. 6 is a block diagram illustrating a nonvolatile memory system in accordance with an embodiment of the present invention.

As shown with reference to FIG. 6, a nonvolatile memory system 600, such as a solid state drive, includes a nonvolatile memory controller 605 coupled to a nonvolatile memory storage module 615 comprising a plurality of NAND chips 630. In this embodiment, the NAND chips 630 store the encoded codewords and the memory controller 605 is designed to execute reading and writing controls for the NAND chips 630 according to reading and writing instructions received from an access device. The nonvolatile memory controller 605 further includes read circuitry 640 configured for determining a threshold voltage of a target cell stored in the nonvolatile memory storage module 615. The nonvolatile memory controller further includes one or more LLR look-up tables 635 associated with the nonvolatile memory storage module 615. Look-up circuitry 650 of the nonvolatile memory controller 605 is configured for extracting an LLR associated with the threshold voltage of the target cell from the one or more LLR look-up tables 635 and for providing the extracted LLR to an LDPC decoder. In determining the threshold voltage of the target cell, the read circuitry 640 may utilize a plurality of soft-decision reference voltages to read a plurality of threshold voltages of the target cell, as previously described.

In one embodiment, the LLR look-up tables 635 may include an LLR look-up table 635 that is associated with a current point in the lifetime of the nonvolatile memory storage module 615. As such, the BER appropriate for the age of the nonvolatile memory storage module 615 may be taken into consideration when generating the LLR look-up tables 635.

The read circuitry 640 of the nonvolatile memory controller 605 may be configured for performing one or more reads of a cell of a nonvolatile memory storage module 615 to generate one or more soft reads associated with a bit stored in the cell. When multiple reads of the same cell are performed by the read circuitry 640, at varying voltage levels, it is necessary to accumulate these multiple reads into a single index that can be used to access an LLR look-up table and to extract the appropriate LLR for the cell from the LLR look-up table. As such, in accordance with the present invention, the nonvolatile memory controller 605 may further include accumulation circuitry 655 coupled to the read circuitry 640. The accumulation circuitry 655 is configured for accumulating the one or more soft reads, performed by the read circuitry 640, to generate an accumulated soft read associated with the bit stored in the cell. The look-up circuitry 650 is coupled to the accumulation circuitry 655 and the look-up circuitry is configured for converting the accumulated soft read into a log-likelihood ratio (LLR) for use in LDPC decoding of a codeword stored in the nonvolatile memory storage module.

In one embodiment, a plurality of reads of the same cell 630 of the nonvolatile memory storage module 615 are performed, each at a different voltage level. The results of the plurality of reads need to be accumulated so that only one LLR is assigned to every bit of the page. In an exemplary embodiment, the first 6 bits of a page of the nonvolatile memory storage module 615 have been written and stored as 1, 1, 1, 0, 0, 0, respectively. In this exemplary embodiment, it is assumed that bits 0 and 3 exhibit no significant error when read from the nonvolatile memory storage module 615. It is also assumed that bits 1 and 4 exhibit a moderate error when read and that bits 2 and 5 exhibit a very large error. The bits of the cell are read three times, once with a low threshold voltage, once with a medium threshold voltage and one with a high threshold voltage, yielding the following results:

|  | Bit # | | | | | |
| --- | --- | --- | --- | --- | --- | --- |
|  | 0 | 1 | 2 | 3 | 4 | 5 |
| Written to Cell | 1 | 1 | 1 | 0 | 0 | 0 |
| 1$^{st}$ Read with Low VT | 1 | 0 | 0 | 0 | 1 | 1 |
| 2$^{nd}$ Read with Mid VT | 1 | 1 | 0 | 0 | 0 | 1 |
| 3$^{rd}$ Read with High VT | 1 | 1 | 1 | 0 | 0 | 0 |
| Sum of 1's Read | 3 | 2 | 1 | 0 | 1 | 2 |
| Assigned LLR | −4 | −1 | +1 | +4 | +1 | −1 |

As shown, bits 0 and 3 are read without error in all three of the reads performed. As such, in this case an LLR will be assigned that has a large magnitude, indicating a high confidence that the read is correct. Additionally, bits 1 and 4 are read correctly twice and incorrectly once, when utilizing the three different reference voltages. As such, a smaller magnitude LLR, indicating a low confidence that performing a read of bits 1 and 4 will produce the correct result, should be assigned to bits 1 and 4. Similarly, bits 2 and 5 are read incorrectly twice and correctly only once. As such, bits 2 and 5 should be assigned a smaller magnitude LLR. It can be seen that the assigned LLR is directly related to the total number of 1's read using each of the reference voltages. In both instances of two 1's being read, the assigned LLR is −1. In both instances of one 1 being read, the assigned LLR is +1. Additionally, in some cases the sign of the assigned LLR may differ from the data originally written to the nonvolatile memory storage 615. When reading of the data stored in the nonvolatile memory storage module 615, it is not possible to determine the correct sign of the data originally written, so it is not possible to know if the sign of the assigned LLR is the same as the data written to the cell. However, when an incorrect sign is assigned to the LLR, the magnitude of the assigned LLR will be small. The nonvolatile memory controller can more easily decode the small magnitude assigned LLR to determine the bits that are in error and to determine the correct sign for the data.

In the present invention, the accumulation circuitry 655 receives the result of the reads from the read circuitry 640 and sums the number of 1's to generate an accumulated soft read. This accumulated soft read is then provided to the look-up circuitry 650 to assign an LLR value from the LLR look-up table 635.

Figure 7:
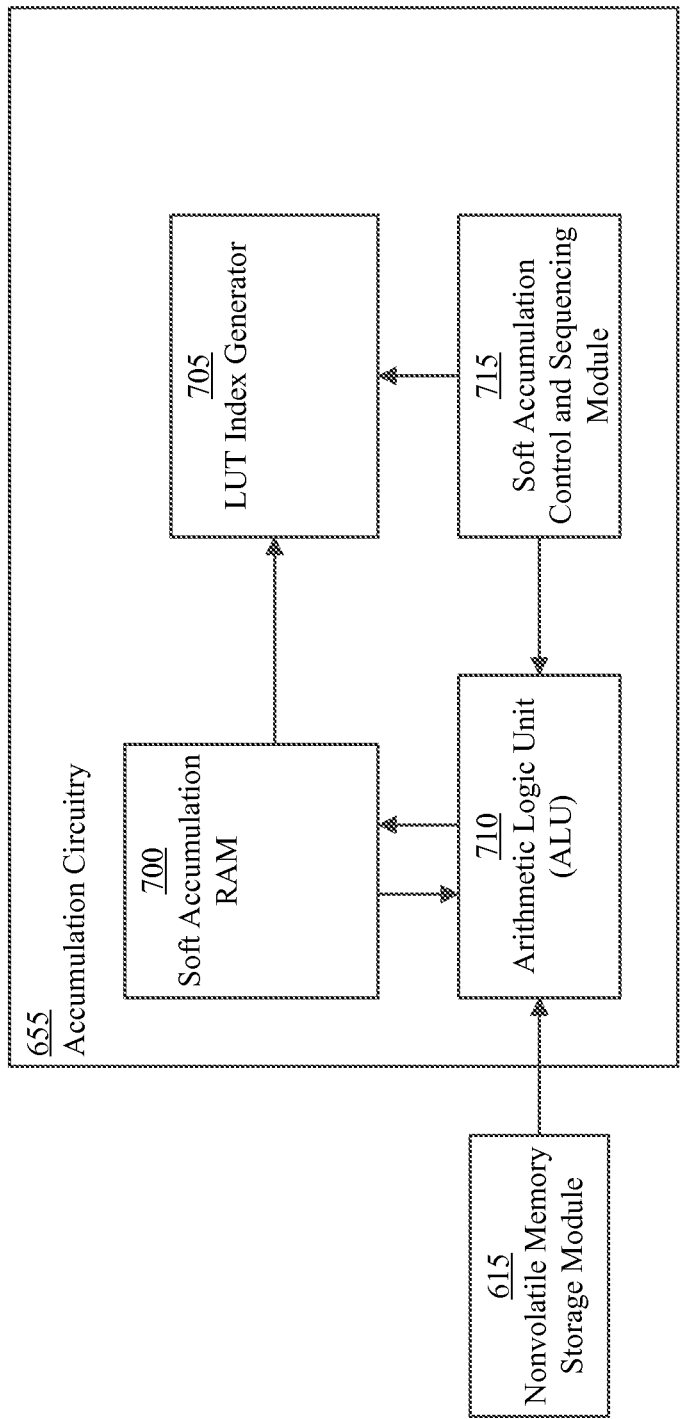
FIG. 7 is a block diagram illustrating accumulation circuitry in accordance with an embodiment of the present invention.

With reference to FIG. 7, the accumulation circuitry 655 may include a soft accumulation RAM 700, an arithmetic logic unit (ALU) 710 coupled to an input of the soft accumulation RAM 700, an LUT index generator 705 coupled to an output of the soft accumulation RAM 700 and a soft accumulation control and sequencing module 715 coupled to an input of the arithmetic logic unit 710 and the LUT index generator 705. In an exemplary embodiment, under the direction of the soft accumulation control and sequencing module 715 the pages of the nonvolatile memory storage module 615 are read one at a time for each bit of the page and the results of the read are stored in the soft accumulation RAM 700. A codeword stored in the nonvolatile memory storage module 615 is comprised of multiple units of data, wherein a unit of data is equal to the width of the data path, which in some instances may be equal to 256 bits. In operation, a unit of data is serially read from the nonvolatile memory storage module 615 as a first operand and a corresponding unit of data is read from the soft accumulation RAM 700 as a second operand. An incrementer of the arithmetic logic unit 710 operates on the first operand and the second operand and either increments or does not increment the second operand based on the first operand to sum the total number of 1's read and writes the result back to the soft accumulation RAM 700. If this is an initial read of the data unit and the soft accumulation RAM 700 does not yet contain any accumulation information, then the soft accumulation control and sequencing module 715 will instruct the ALU 710 to initialize the result according to the state of the first operand. The process of accumulating the running result based on the first operand and the second operand is repeated for all the units of data of the codeword and the result is accumulated in the soft accumulation RAM 700. After three reads of the page, each bit will have an accumulated soft read having a result between 0 and 3, which is representative of the number of times the bit is read as a 1 from the cell. This accumulated soft read is provided to the LUT index generator 705 to generate an index to be used by the look-up circuitry 650 of the nonvolatile memory controller 605 to access the appropriate look-up table for the nonvolatile memory storage module 615 from which the bits were read. An appropriate set of LLRs may be stored in the look-up table for this operation and the soft accumulation control and sequencing module 715 may perform the initialization of the look-up table. As previously described, each of the reads of the page may be performed using a different threshold voltage.

In an additional embodiment, the nonvolatile memory storage module 615 may further include compression circuitry 660 for compressing the one or more soft reads to generate a compressed soft read prior to transferring the one or more soft reads to the nonvolatile memory controller 605. In an exemplary embodiment, 7 reads are performed at varying threshold voltages. Performing 7 reads requires that the same page of the nonvolatile memory storage module 615 to be read 7 times and that the result of each of the reads be transferred across the interface to the nonvolatile memory controller 605. The transfer between the nonvolatile memory storage module 615 and the nonvolatile memory controller 605 is typically performed at a rate of 2 bytes per clock for a double-data-rate (DDR) interface. To reduce the time required to transfer the soft reads between the nonvolatile memory storage module 615 and the nonvolatile memory controller 605, the nonvolatile memory storage module 615 may include compression circuitry 660. With the compression circuitry 660, the 7 reads are performed, but instead of transferring all of the soft reads resulting from the 7 reads to the nonvolatile memory controller 605, the compression circuitry 660 first compresses the soft reads to generate a compressed soft read that is representative of the sum of the number of 1's read for each bit and then transfers the compressed soft read to the nonvolatile memory controller 605 for further processing. In one embodiment, the 7 soft reads may be performed, but only the sum of the number of 1's read for each bit may be transferred to the nonvolatile memory controller 605, so each bit is represented by a compressed soft read that is a number between 0 and 7. The compressed soft read may be represented by a 3 bit number, thereby requiring the page to be transferred across the DDR interface only 3 times, once for each bit of the compressed soft read.

In operation, the ALU 710 performs a concatenation operation on the 3 bit number transferred by the 3 pages across the DDR interface from the nonvolatile memory storage module 615. In performing the concatenation, the first page read may contain the lower order bit of the compressed soft read, the second page read may contain the second significant bit that needs to be concatenated with the lower order bit and the third page may contain the third significant bit that needs to be concatenated with the lower order bit and the second significant bit. The ALU 710 performs the concatenation of the 3 bit number to generate the compressed soft read.

After the compressed soft read is received by the nonvolatile memory controller 605, the soft reads needs to be reconstructed to regenerate the original 7 reads of the cell. The accumulation circuitry of the nonvolatile memory controller 605 is further configured for reconstructing the compressed soft reads to regenerate the one or more soft reads. In one embodiment, upon receiving the compressed soft read from the compression circuitry 660 of the nonvolatile memory storage module 615, the accumulation circuitry 655 of the nonvolatile memory controller 605 reconstructs the soft reads from the compressed soft reads by concatenating the 3 pages of compressed soft reads to regenerate the original 7 soft reads. The compressed soft read is then provided to the look-up circuitry 650 for indexing the appropriate look-up table 635 to extract the LLR for the bit stored by the cell.

As previously mentioned, the ideal distribution of a SLC device is influenced by the data programmed into the adjoining cells in the device. One of the largest contributing factors affecting the distribution width of a target cell is the cell-to-cell floating gate coupling, which is influenced by the target cell's neighboring cells.

Figure 8:
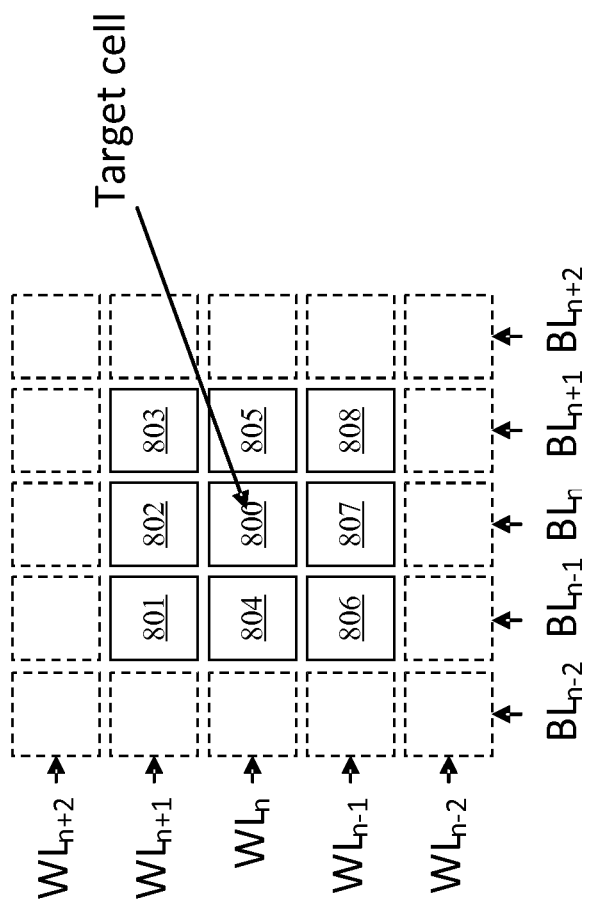
FIG. 8 illustrates a target cell surrounded by neighboring cells in accordance with an embodiment of the present invention.
Figure 9:
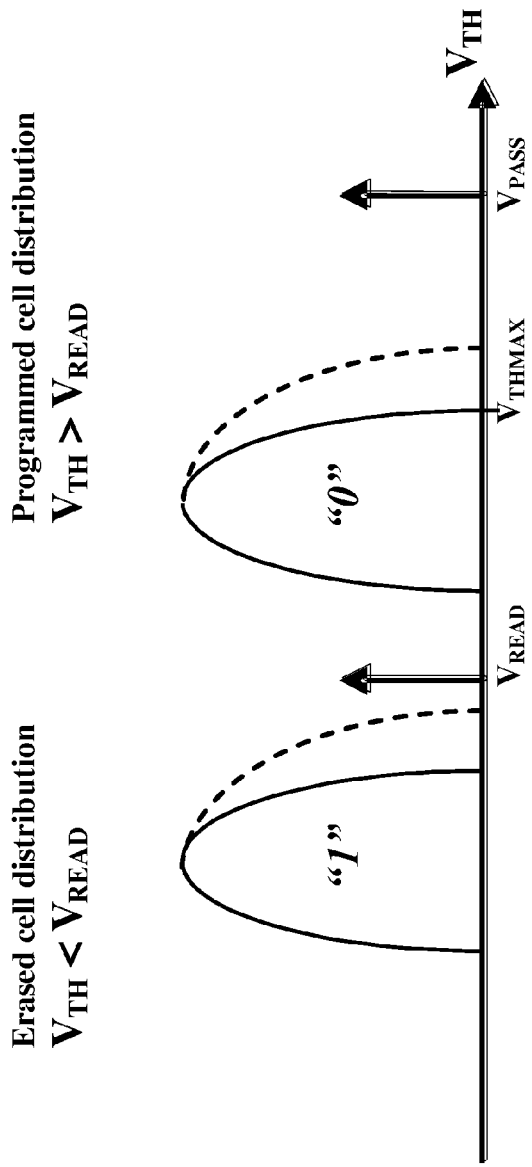
FIG. 9 is a graphical illustration of a distribution level for an SLC device after the neighboring cells have been programmed.

FIG. 8 illustrates a target cell 800 surrounded by its 8-most neighboring cells 801, 802, 803, 804, 805, 806, 807, 808. Due to the nature of the NAND architecture, coupling capacitance exists between the target cell 800 and the neighboring cells 801, 802, 803, 804, 805, 806, 807, 808. Depending upon the data to be programmed into the cell, the target cell 800 is programmed to a distribution of "0" or remains in the erased state of "1". Sequentially, the surrounding cells (or a subset of surrounding cells) are programmed to their target distributions. Surrounding cells (or a subset of surrounding cells) move from the erased distribution to the written distribution. As a result of this, there is a change in the electric field of the target cell 800. This electric field is reflected as a voltage threshold shift for the target cell 800 that appears "more programmed". As a result, the target cell's 800 distribution experiences an enlargement on the right side of the distribution curve, as illustrated by the dotted lines in FIG. 9. As such, if a target cell, belonging to the "1" distribution, crosses the $V_{READ}$ level after the programming of the surrounding cells, it will be read in error as a "0".

Figure 10:
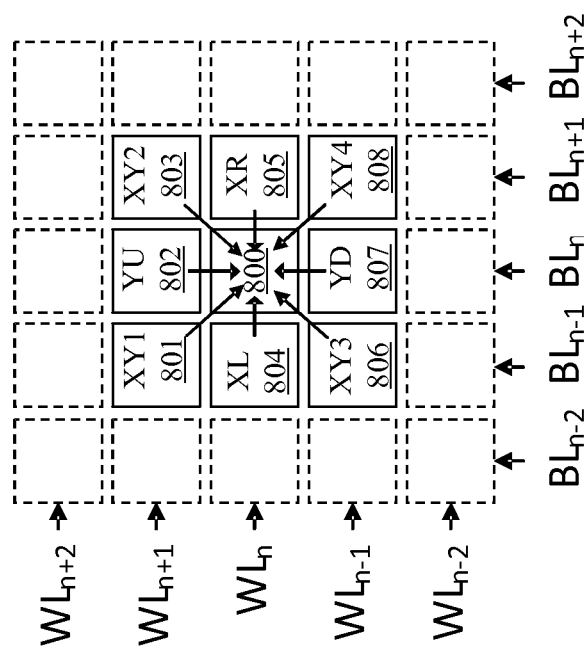
FIG. 10 is an illustration of the coupling coefficients of neighboring cells to a target cell in accordance with an embodiment of the present invention.

Each of the cells 801, 802, 803, 804, 805, 806, 807, 808 surrounding the target cell 800 contributes to the distribution of the target cell 800, depending upon the capacitive coupling ratio between the target cell 800 and the neighboring cells 801, 802, 803, 804, 805, 806, 807, 808. For each neighboring cell 801, 802, 803, 804, 805, 806, 807, 808 the effect on the distribution is dependent upon the coupling coefficients between the target cell 800 and the neighboring cells 801, 802, 803, 804, 805, 806, 807, 808 and the distribution voltage shift during program operation of the neighboring cells 801, 802, 803, 804, 805, 806, 807, 808. FIG. 10 illustrates the coupling coefficient of the eight neighboring cells 801, 802, 803, 804, 805, 806, 807, 808 that affect the target cell 800.

Typically, cells in a page are sequentially programmed from the bottom to the top ($WL_{n-2}$ to $WL_{n+2}$). In this way, background pattern dependency is minimized. Additionally, cell-to-cell coupling effects are mitigated for the target cell 800, because lower cells (pages) are programmed before the target cells 800. However, this order of programming is true only if the target cell 800 is reprogrammed (or programmed) to "0". Alternatively, if the target cell 800 stays in the erased state, it will be affected by the lowest cells as well as the highest cells, because it is not possible to lower the threshold voltage during program operation. Only the erase operation of the cells can lower the threshold voltage. As such, for an erased cell, the effect of all the surrounding cells must be considered.

The coupling coefficients of the cells do not all have the same values/weights. Experimental results show that Y coefficients 802, 807 are dominant, followed by X 804, 805 then XY 801, 803, 806, 808. Bit errors introduced by the coupling coefficients (and other phenomena) can be corrected using an ECC, such as LDPC encoding.

Additionally, in order to provide a higher quality LLR for a target cell, the effect of the programmed states of the neighboring cells on the threshold voltage of the target cell need to be considered. In the present invention to address the contribution of the programmed state of the neighboring cells to the threshold voltage of a target cell, the LLR look-up tables 635 of the nonvolatile memory controller 605 includes one or more neighboring cell contribution LLR look-up tables. The neighboring cell contribution LLR look-up tables are populated to be representative of the BER of a target cell (bit error probability) for each combination of possible patterns of the surrounding cells. As such, the elements of the neighboring cell contribution LLR look-up tables are dependent upon the effects of the programmed state of some or all of the neighboring cells of the target cell. With reference to FIG. 8, for each target cell, $2^9$=512 combinations of 0/1 are possible in considering all of the 9 cells 801, 802, 803, 804, 805, 806, 807 and 808 surrounding the target cell 800.

FIG. 11 illustrates a pattern table 1100 for the neighboring cells 801, 802, 803, 804, 805, 806, 807 and 808 surrounding the target cell 800. In accordance with the present invention, the pattern table 1100 in FIG. 11 may include all of the $2^9=512$ pattern combinations for the 8 surrounding cells 801, 802, 803, 804, 805, 806, 807 and 808 and the target cell 800 and the ALU 710 of the present invention generates an index for the LLR look-up table based upon the value of target cell 800 itself and the values of some or all of the neighboring cells 801, 802, 803, 804, 805, 806, 807 and 808 of the target cell 800. In the present invention, the ALU 710 generates a LUT index value for each bit of a codeword which takes into account the effects of the neighboring cells on the target cells associated with the codeword.

In addition, it is possible that the values of all neighboring cells 801, 802, 803, 804, 805, 806, 807 and 808 may not need to be fully determined for the application of the invention. For example, in the case of an MLC, the two states of the MSB value may have a larger voltage difference than the two LSB states. So, the MSB bit of the neighboring cells may influence the target cell 800 the most and the LSB bit of the neighboring cells may be ignored.

Figure 12:
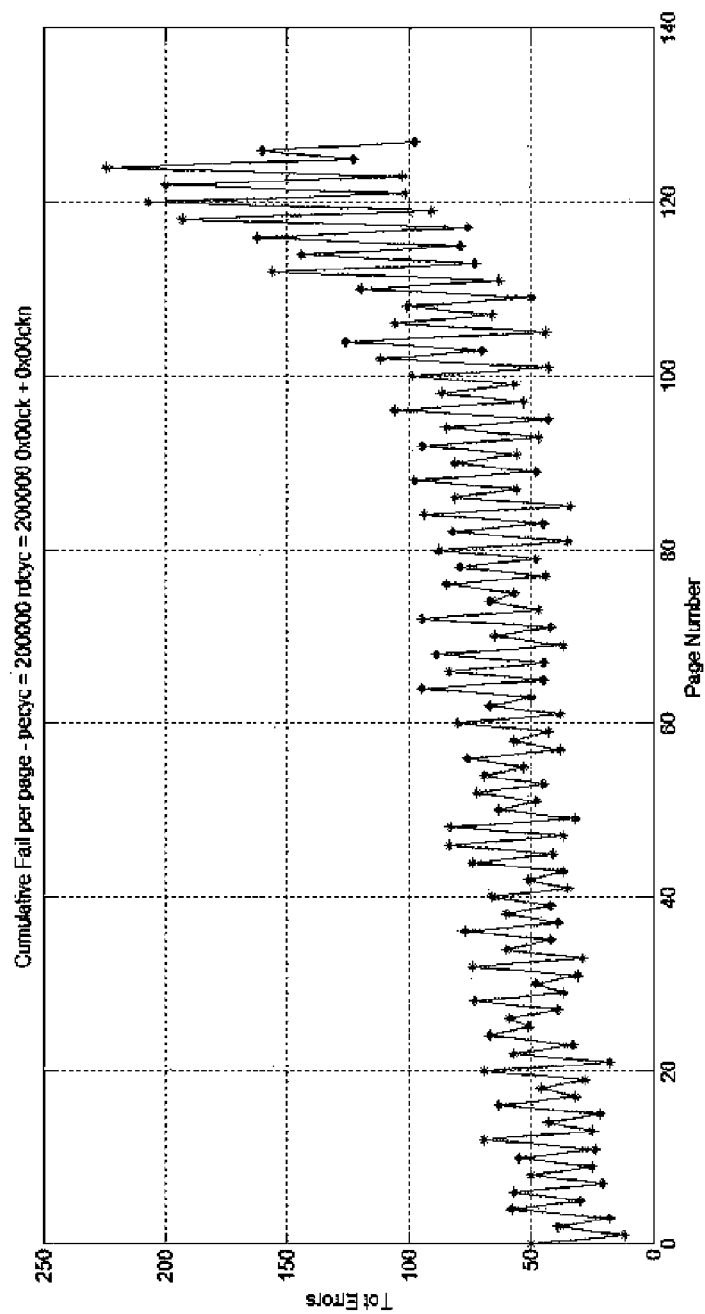
FIG. 12 is a graphical illustration of the average fail distribution inside pages of a NAND device.

Experimental results show that the BER of the target cell 800 is page dependent. As such, the LUT index generated by the ALU 710 may take into account the particular page of the target cell. FIG. 12 illustrates a typical fail distribution as a function of page number (x-axis). As shown, fails are not uniformly distributed among pages, but instead, the number of fails has a tendency to increase with page number. The generated LUT index may also take into account whether the page of the target cell is an even page or an odd page. Additionally, the LUT index may be generated to address the different BERs associated with lower pages vs. higher pages in the nonvolatile memory storage module 615. Various other considerations of the BER in the generation of the appropriate LUT index for the particular NAND device are within the scope of the invention.

Because the contribution from the neighboring cells is dependent upon the programmed state of the target cell, one or more neighboring cell contribution LLR look-up tables 635 may include a first neighboring cell contribution look-up table associated with a programmed state of the target cell and a second neighboring cell contribution look-up table associated with an unprogrammed state of the target cell, wherein the first neighboring cell contribution look-up table 635 is different than the second neighboring cell contribution look-up table 635.

In order to determine the LLRs it is necessary to know the states of the cells surrounding the target cell so that the pattern can be determined and the appropriate LLR can be extracted from the neighboring cell contribution LLR look-up table 635. The nonvolatile memory storage module 615 comprises a plurality of pages which may be organized in an interleaved architecture or, alternatively, in an all-bit-line (ABL) architecture.

Figure 13:
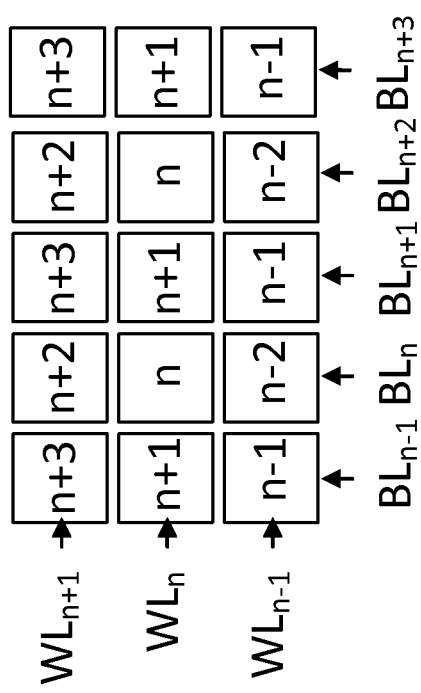
FIG. 13 is an illustration of the page organization for an interleaving architecture in a NAND device.

In an exemplary embodiment, in the case of an interleaving NAND memory architecture, two pages belong to the same word-line (WL). As shown with reference to FIG. 13, to measure the pattern of the surrounding cells of a target cell on page n, requires the reading of pages: n+3, n+2, n+1, n, n−1, n−2. In a random read case, these six pages need to be read in order to be able to correct page "n". An additional advantage can be realized when utilizing a sequential read access for the interleaved NAND memory architecture. While there is still a latency associated with the six pages read in a sequential read, the same six pages needed to correct page "n" can also be used to correct page "n+1". As such, in a sequential read access, a latency of six reads exists, but there is no associated overhead, i.e. 2 pages read in order to correct 2 pages, or 1 read/page.

Figure 14:
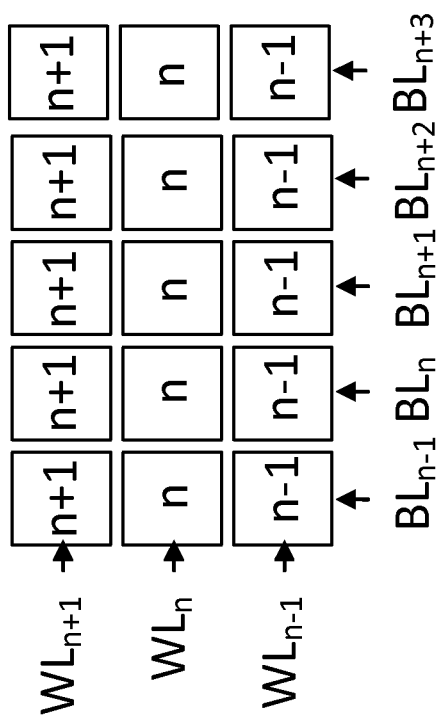
FIG. 14 is an illustration of the page organization for an all bit-line architecture in a NAND device.

In an additional embodiment, as shown with reference to FIG. 14, in the case of an all bit-line architecture, to measure the pattern of the surrounding cells of a target cell on page n, requires the reading of pages: n−1, n, n+1. In a random read case, these three pages must be read in order to be able to correct page "n". An additional advantage can be realized when utilizing a sequential read access. While there is still a latency associated with the three pages read in a sequential read, once page "n" in corrected, it is only necessary to read page "n+2" in order to be able to correct page "n+1". As such, in all bit-line sequential read access, a latency of 3 reads exists, but there is no associated overhead: 1 page read in order to correct 1 page, or 1 read/page The plurality of LLR look-up tables reflecting the effects of the neighboring cells are stored in the flash memory controller and in operation, the flash memory controller selects the appropriate LLR look-up table to use for decoding the codeword.

In the present invention, an LLR look-up table need not be a physical entity, but may be considered in a broader sense to be a logical entity. Additionally, the various LLR look-up tables reflecting the current BER of the device may be independent look-up tables or may alternatively be subsets of a larger look-up table.

The present invention utilizes a pattern recognition circuit to identify a pattern of the state of some or all of the neighboring cells in addition to the value of a target cell. The interpretation of the pattern by the pattern recognition circuit takes into account the proximity of the neighboring cells to the target cell, electrical coupling strengths, etc. The pattern recognition circuit translates the pattern into an LLR value for storage into an LLR table. Many different patterns may translate to the same LLR value. A particular pattern for one vendor's flash technology may translate into a different LLR on another vendor's flash technology because the same pattern may be representing a different physical layout of the cells. Furthermore, the LLR a certain pattern translates to may change over time as a result of the program/erase cycles. For example, pattern A may translate to LLR "x" at the beginning of the life of the flash device, but after 8,000 erase cycles, pattern A may now translate to LLR "y". The LLRs stored in the look-up tables may reflect both the contribution of the neighboring cells to a cell being read and the change of the contribution over the device lifetime.

Additionally, it is not necessary to consider all of the neighboring cells in the LLRs. For example, the diagonal neighbors may have a weaker electrical coupling with the center cell and may be omitted. While the final LLR value for the center cell may not be quite as accurate as it could be when considering all the neighboring cells, omitting the diagonal neighbors may save additional flash read and processing time. The tradeoff in increased performance by omitting some of the neighboring cells may be preferred in a particular application.

In accordance with the present invention, the nonvolatile memory controller 605 is configured for performing one or more reads of one or more neighboring cells of the cell of the nonvolatile memory storage module to generate one or more neighboring cell soft reads associated with a bit stored in the one or more neighboring cells. Reading the neighboring cells of a target cells results in soft-decision information in the form of one or more soft reads. These one or more soft reads need to be accumulated to generate an accumulated soft read that can be used to index a neighboring cell contribution LLR look-up table associated with the nonvolatile memory storage module 615 to extract the appropriate LLR for the cell from the table. The accumulation circuitry 655 of the nonvolatile memory controller 605 is configured for concatenating the one or more soft reads associated with the bit stored in the cell and the one or more neighboring cell soft reads associated with the bit stored in the one or more neighboring cells to generate the accumulated soft read associated with the bits stored in the cell. The look-up circuitry 650 is coupled to the accumulation circuitry 655 and the look-up circuitry is configured for using the accumulated soft read to index an LUT table to identify a log-likelihood ratio (LLR) for use in LDPC decoding of a codeword stored in the nonvolatile memory storage module.

In an exemplary embodiment wherein page "n" and the programming of page "n+1" has affected the bits of page "n", the bit "n" from the target cell is read to generate a soft read for the bit and the one or more neighboring cells of the target cell (page n+1) are read to generate one or more neighboring soft reads. Accumulating the soft read of the bit and the neighboring soft reads requires that concatenation of the soft bits. The concatenation of the soft bits may be performed by the arithmetic logic unit 710 of the accumulation circuitry 655 in combination with the soft accumulation RAM 700 and under the direction of the soft accumulation control and sequencing module 715. In operation, for a target bit having one or more neighboring cells that induce electrical coupling effects on the target bit, the ALU 710 may be instructed by the soft accumulation control and sequencing module 715 to concatenate the value of the target bit with the value of the two neighboring bits of the target bit. The target bit 800 stored in the nonvolatile memory storage module has both logical neighbors and physical neighbors. It is the programmed state of the physical neighbors that effects the programmed state of the target bit 800. In a particular embodiment, the physical neighboring bits of the target bit 800 may not be the logical neighbors of the target bit 800. In an exemplary embodiment, the neighboring bits may be 8 bit positions away from the target bit 800 in the logical structure of the data. To identify the physical neighbors of the target cell 800, a multiplexor may be included to select the correct physical neighbors prior to the concatenation process previously described.

In an exemplary embodiment, assuming the sequence of bit in page "n" starts as:
0 0 1 1 0 1 1 0 0 . . . .
To perform the concatenation, each bit of page "n" is converted into a result that consists of the soft read of the bit itself concatenated with the soft read of the bit on the left and the soft read of the bit on the right. Since the first bit of the sequence has no bit on the left and the last bit in the sequence has no bit on the right, it is assumed that these bits are "0", because a zero value has the least effect on the bit being read. In performing the concatenation, the starting bits become:
000 001 101 110 011 101 110 010 00 . . . 0 . . . .
(the first dot refers to bit 9 since that bit is to the right of bit 8, etc.)
After the concatenation is performed, page "n+1" is read to generate the neighboring soft reads. The neighboring cells in the exemplary embodiment the electrical coupling between is a result of bit "p" of page "n+1" being coupled to bit "p" of page "n". Following the reading of page "n+1", the arithmetic logic unit 710 shifts the running RAM result temporarily stored in the soft accumulation RAM 700 to the left by one and concatenates the corresponding bit of page "n+1" to that result to generate the final concatenated result:

|  | page n + 1 | | | | | | | | | |
| --- | --- | --- | --- | --- | --- | --- | --- | --- | --- | --- |
|  | 1 | 1 | 0 | 0 | 1 | 1 | 0 | 0 | 1 | ... |
| current result: | 000 | 001 | 101 | 110 | 011 | 101 | 110 | 010 | 00. | ... |
| final result: | 0001 | 0011 | 1010 | 1100 | 0111 | 1011 | 1100 | 0100 | 00.1 | ... |

If there are additional pages to be considered in the electrical coupling of the target cell, the process is repeated as appropriate. The final result of the concatenation is transformed into an LLR that is appropriate for the neighboring cell pattern associated with each bit of the page as previously described.

Figure 15:
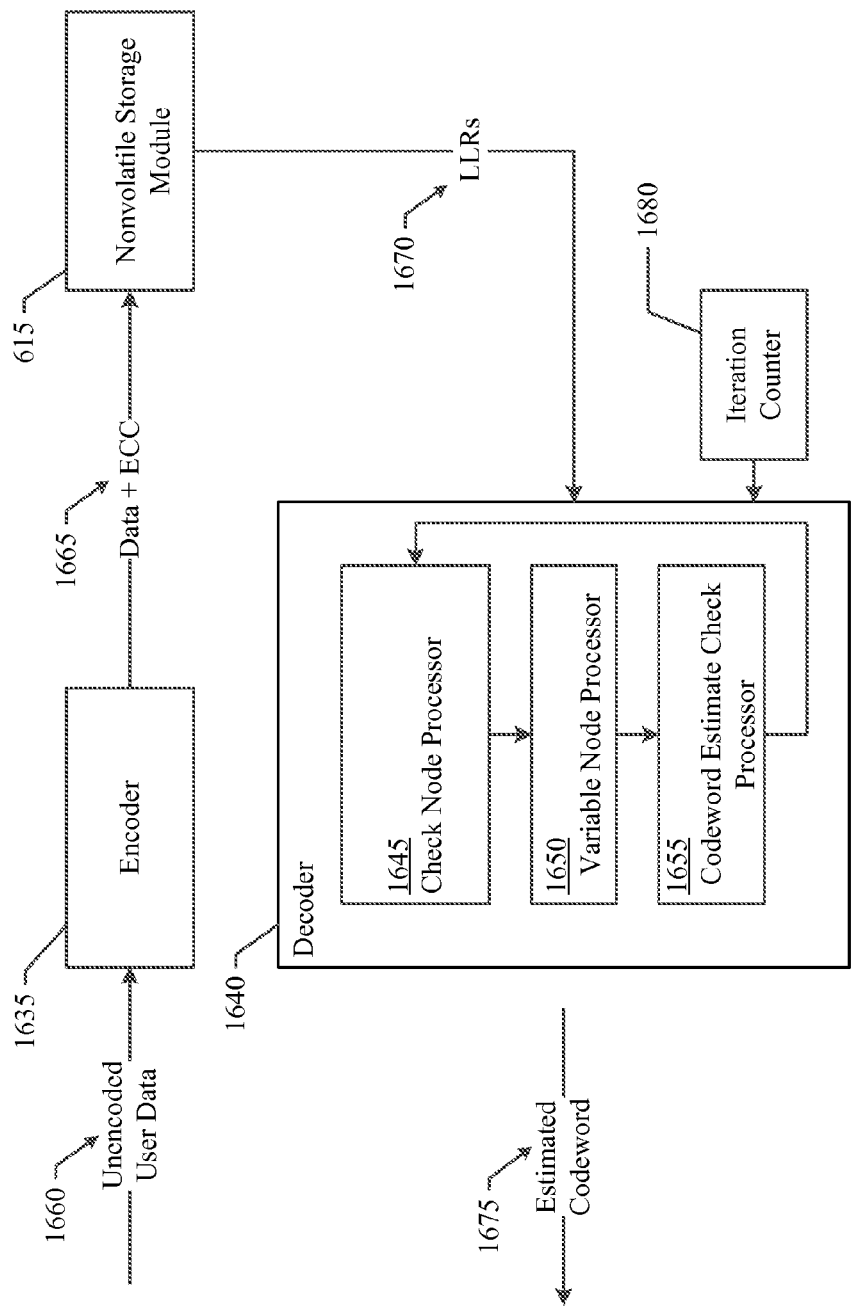
FIG. 15 is a block diagram illustrating LDPC encoding and LDPC decoding in accordance with an embodiment of the present invention.

The nonvolatile memory storage module 615 of FIG. 6 may be incorporated into a LDPC system as shown with reference to FIG. 15. As shown, the LDPC system may comprise an encoder 1635 that is responsible for adding the parity bits to the unencoded user data 1660 in accordance with a low-density parity check (LDPC) code. The LDPC encoded data 1665, which includes the unencoded user data 1660 and an error correction code, may then be stored as encoded codewords in the nonvolatile memory storage module 615. In a particular embodiment, the nonvolatile memory storage module 615 may include a plurality of NAND chips 630. The nonvolatile memory storage module 615 and a nonvolatile memory controller 605 having a plurality of LLR look-up tables 635 may be integrated into a nonvolatile memory system 600 as previously described with reference to FIG. 6.

In operation of the present invention, during a read operation of the nonvolatile memory storage module 615, multiple reads of the stored codewords, and possibly the neighboring cells, are executed to provide soft-decision information represented by the LLRs 1670 extracted from an LLR look-up table 635 that is specific to the cells of the device. The LLR look-up tables 635 may also include the current point in the lifetime of the device, which may be identified by the BER of the device or by other means, such as by counting the P/E cycles of the device. The LLRs 1670 are used as input to the LDPC decoder 1640 to decode the unencoded user message data 1660 encoded by the encoder 1635, utilizing LDPC coding following a parity check matrix (H). The received LLR values for each variable node are taken as the initial variable node messages. The check node processor 1645 updates the check nodes of a first layer with the variable node messages to which they are connected. The resulting messages of the check node processor 1645 are then passed to the variable node processor 1650 and the variable node processor 1650 then updates each variable node with the check node messages to which they are connected. The iterative decoding process continues, as is known in the art, and the resulting codeword estimate is then checked by a codeword estimate check processor 1655, to verify whether or not the codeword estimate is a valid codeword. In a particular embodiment, the codeword estimate may be multiplied by the parity check matrix to determine the syndrome and if the syndrome is zero, it may be determined that the codeword estimate is a valid codeword. If the codeword estimate is determined to be a valid codeword, the decoding is complete and the estimated codeword is provided as output 1675 from the decoder 1640. If it is determined by the codeword estimate check processor 1655 that the codeword estimate is not a valid codeword, a second iteration of the decoding begins. The iteration counter 1680 may be used to track the number of iterations of the decoding process and may cause the decoding to terminate if a maximum number of iterations is reached.

Figure 16:
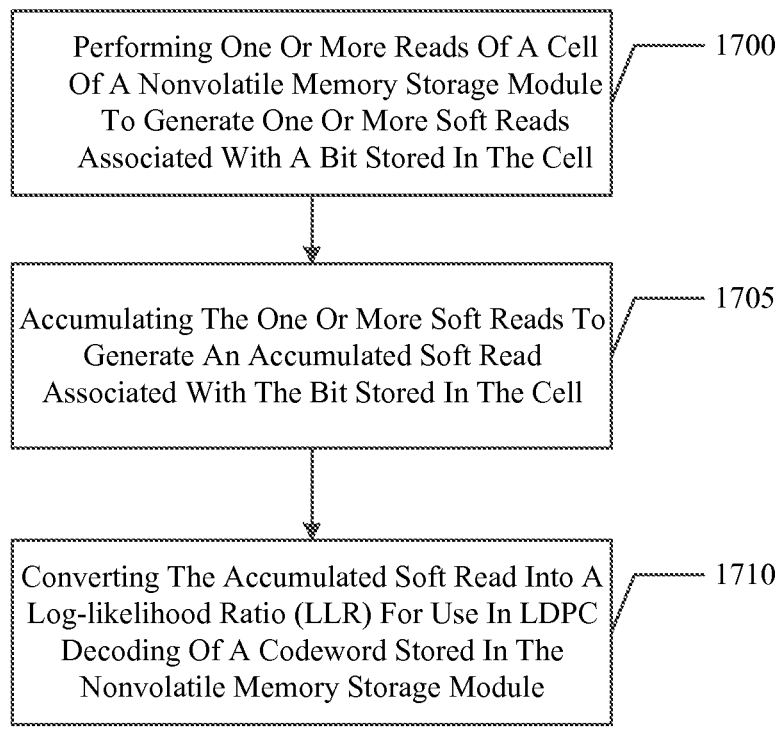
FIG. 16 is a flow diagram illustrating a method of accumulating soft reads for use in an LDPC decoder in accordance with an embodiment of the present invention.

With reference to FIG. 16, a method of accumulating soft information of a nonvolatile memory storage module for use in LDPC (Low-Density Party Check) decoding of a codeword stored in the nonvolatile memory storage module is described. The method begins by performing one or more reads of a cell of a nonvolatile memory storage module to generate one or more soft reads associated with a bit stored in the cell 1700. In one embodiment read circuitry 640 of the nonvolatile memory controller 605 may be used for performing one or more reads of a cell of a nonvolatile memory storage module 615. Performing one or more reads of a cell of a nonvolatile memory storage module to generate one or more soft reads associated with a bit stored in the cell may further include performing each of the one or more soft reads of the cell using a different threshold voltage. Additionally, performing one or more reads of a cell of a nonvolatile memory storage module 615 to generate one or more soft reads associated with a bit stored in the cell may further include, performing one or more reads of one or more neighboring cells of the cell of the nonvolatile memory storage module to generate one or more neighboring cell soft reads associated with a bit stored in the one or more neighboring cells. Additionally, one or more soft reads may be performed to transfer soft information or compressed information from the nonvolatile memory storage module to the nonvolatile memory controller.

Following the generation of the one or more soft reads associated with a bit stored in the cell, the method continues by accumulating the one or more soft reads to generate an accumulated soft read associated with the bit stored in the cell 1705. In one embodiment, the accumulation circuitry 655 accumulates the one or more soft reads to generate an accumulated soft read associated with the bit stored in the cell. In a particular embodiment, each of the one or more soft reads is representative of a logical "1" or a logical "0" and accumulating the one or more soft reads to generate an accumulated soft read associated with the bit stored in the cell further comprises, summing the soft reads representative of a logical "1" to generate the accumulated soft read associated with the bit stored in the cell. In an additional embodiment, the one or more reads of a cell of a nonvolatile memory storage module 615 may be compressed by compression circuitry 660 to generate a compressed soft read. In this embodiment, the compressed soft read is reconstructed to regenerate the one or more soft reads prior to accumulating the one or more soft reads to generate the accumulated soft read. In one embodiment, accumulating the one or more soft reads to generate an accumulated soft read associated with the bit stored in the cell further includes, concatenating the one or more soft reads associated with the bit stored in the cell and the one or more neighboring cell soft reads associated with the bit stored in the one or more neighboring cells.

Following the generation of the accumulated soft read associated with the bit stored in the cell, the method continues by converting the accumulated soft read into a log-likelihood ratio (LLR) for use in LDPC decoding of a codeword stored in the nonvolatile memory storage module 1710.

The present invention provides an efficient method of acquiring, accumulating and processing soft information for use in LDPC decoding. The accumulation may include incrementation, concatenation, collation, shifting and various other operations, performed independently or in combination, for the generation of a look-up table index to provide an appropriate LLR to be used in the LDPC decoding.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of accumulating soft information of a nonvolatile memory storage module for use in LDPC (Low-Density Party Check) decoding of a codeword stored in the nonvolatile memory storage module, the method comprising:
    performing a plurality of reads of a cell of a nonvolatile memory storage module to generate a plurality of soft reads associated with a bit stored in the cell;
    accumulating the plurality of soft reads by summing the number of soft reads having a particular logical value to generate an accumulated soft read associated with the bit stored in the cell, wherein the accumulated soft read has a numerical value equal to the sum of the number of soft reads having a particular logical value; and
    converting the accumulated soft read into a log-likelihood ratio (LLR) for use in LDPC decoding of a codeword stored in the nonvolatile memory storage module.

2. The method of claim 1, wherein performing a plurality of reads of a cell of a nonvolatile memory storage module to generate a plurality of soft reads associated with a bit stored in the cell further comprises, performing each read of the plurality of soft reads of the cell using a different threshold voltage.

3. The method of claim 1, wherein each of the reads of the plurality of soft reads is representative of a logical "1" or a logical "0" and accumulating the plurality of soft reads by summing the number of soft reads having a particular logical value to generate an accumulated soft read associated with the bit stored in the cell further comprises, summing the soft reads representative of a logical "1" to generate the accumulated soft read associated with the bit stored in the cell, wherein the accumulated soft read associated with the bit stored in the cell comprises a single numerical value.

4. The method of claim 1, further comprising, after performing a plurality of reads of a cell of a nonvolatile memory storage module to generate a plurality of soft reads associated with a bit stored in the cell further comprises, compressing the plurality of soft reads, the summing the number of soft reads having a particular logical value generating a compressed soft read comprising a single numerical value, wherein the single numerical value is represented by a plurality of bits.

5. The method of claim 4, wherein performing a plurality of reads of a cell of a nonvolatile memory storage module to generate a plurality of soft reads associated with a bit stored in the cell further comprises, performing each of the soft reads of the plurality of soft reads of the cell using a different threshold voltage.

6. The method of claim 4, wherein each of the soft reads in the plurality of soft reads is representative of a logical "1" or a logical "0" and wherein summing the number of soft reads having a particular logical value to identify a single numerical value associated with the bit stored in the cell further comprises, summing the plurality of soft reads representative of a logical "1" to generate the single numerical value associated with the bit stored in the cell.

7. The method of claim 4, further comprising sending to a nonvolatile memory controller a first page that includes one of the bits in the plurality of bits; and
   sending to the nonvolatile memory controller one or more additional pages, each of the additional pages including one of the bits in the plurality of bits, until all of the bits in the plurality of bits have been sent to the nonvolatile memory controller;
   wherein the accumulating the plurality of soft reads further comprises receiving the first page and the one or more additional pages at the nonvolatile memory controller; and
   concatenating the bits of the plurality of bits in the first page and the one or more additional pages to generate the accumulated soft read associated with the bits stored in the cell.

8. The method of claim 1, wherein performing a plurality of reads of a cell of a nonvolatile memory storage module to generate a plurality of soft reads associated with a bit stored in the cell further comprises, performing one or more reads of one or more neighboring cells of the cell of the nonvolatile memory storage module to generate one or more neighboring cell soft reads associated with a bit stored in the one or more neighboring cells.

9. The method of claim 8, wherein performing one or more reads of the one or more neighboring cells of the cell of the nonvolatile memory storage module to generate one or more neighboring cell soft reads associated with a bit stored in the one or more neighboring cells further comprises, performing each of the one or more soft reads of the one or more neighboring cells using a different threshold voltage.

10. The method of claim 8, wherein accumulating the one or more soft reads to generate an accumulated soft read associated with the bit stored in the cell further comprises, concatenating the plurality of soft reads associated with the bit stored in the cell and the one or more neighboring cell soft reads associated with the bit stored in the one or more neighboring cells.

11. A nonvolatile memory controller for accumulating soft information of a nonvolatile memory storage module for use in LDPC (Low-Density Parity Check) decoding of a codeword stored in the nonvolatile memory storage module, the nonvolatile memory controller comprising:
   read circuitry configured for performing a plurality of reads of a cell of a nonvolatile memory storage module to generate a plurality of soft reads associated with a bit stored in the cell;
   accumulation circuitry coupled to the read circuitry, the accumulation circuitry configured for accumulating the plurality of soft reads to generate an accumulated soft read associated with the bit stored in the cell, wherein the accumulated soft read has a numerical value equal to the sum of the number of soft reads having a particular logical value; and
   look-up circuitry coupled to the accumulation circuitry, the look-up circuitry configured for converting the accumulated soft read into a log-likelihood ratio (LLR) for use in LDPC decoding of a codeword stored in the nonvolatile memory storage module.

12. The nonvolatile memory controller of claim 11, wherein the read circuitry is further configured for performing each read of the plurality of reads of the cell using a different threshold voltage.

13. The nonvolatile memory controller of claim 11, wherein each of the reads of the plurality of reads is representative of a logical "1" or a logical "0" and wherein the accumulation circuitry is further configured for summing the soft reads representative of a logical "1" to generate the accumulated soft read associated with the bit stored in the cell.

14. The nonvolatile memory controller of claim 11, wherein the nonvolatile memory storage module comprises read circuitry configured for performing the plurality of reads of a cell of a nonvolatile memory storage module to generate the plurality of soft reads associated with a bit stored in the cell and the nonvolatile memory storage module further comprises compression circuitry for compressing the plurality of soft reads by summing the number of soft reads having a particular logical value to generate a compressed soft read having the numerical value, wherein the numerical value is represented by a plurality of bits.

15. The nonvolatile memory controller of claim 14, wherein each of the reads of the plurality of soft reads is representative of a logical "1" or a logical "0" and wherein the compression circuitry is further configured for summing the plurality of soft reads representative of a logical "1" to generate the compressed soft read.

16. The nonvolatile memory controller of claim 14, wherein the accumulation circuitry is further configured for concatenating the plurality of soft reads associated with the bit stored in the cell and the one or more neighboring cell soft reads associated with the bit stored in the one or more neighboring cells to generate the accumulated soft read associated with the bits stored in the cell.

17. The nonvolatile memory controller of claim 11, wherein the read circuitry is further configured for performing one or more reads of one or more neighboring cells of the cell of the nonvolatile memory storage module to generate one or more neighboring cell soft reads associated with a bit stored in the one or more neighboring cells.

18. The nonvolatile memory controller of claim 11, further comprising one or more LLR look-up tables associated with the nonvolatile memory storage module.

19. A system for accumulating soft information for use in LDPC (Low-Density Parity Check) decoding, the system comprising:
   a nonvolatile memory storage module storing a codeword;
   read circuitry coupled to the nonvolatile memory storage module, the read circuitry configured for performing a plurality of reads of a cell of the nonvolatile memory storage module to generate a plurality of soft reads associated with a bit stored in the cell;
   accumulation circuitry coupled to the read circuitry, the accumulation circuitry configured for accumulating the plurality of soft reads to generate an accumulated soft read associated with the bit stored in the cell, wherein the accumulated soft read has a numerical value equal to the sum of the number of soft reads having a particular logical value; and
   look-up circuitry coupled to the accumulation circuitry, the look-up circuitry for converting the accumulated soft read into a log-likelihood ratio (LLR) for use in LDPC decoding of the codeword stored in the nonvolatile memory storage module.

20. The system of claim 19 further comprising:
a nonvolatile memory controller;
compression circuitry for compressing the plurality of soft reads by summing the number of soft reads having a particular logical value to generate a compressed soft read consisting of the numerical value, wherein the numerical value is represented by a plurality of bits, the compression circuitry configured for sending to the nonvolatile memory controller a first page that includes one of the bits in the plurality of bits and one or more additional pages, each of the additional pages including one of the bits in the plurality of bits, until all of the bits in the plurality of bits have been sent to the nonvolatile memory controller; and
wherein the nonvolatile memory controller is further configured for receiving the first page and the one or more additional pages and concatenating the bits of the plurality of bits in the first page and the one or more additional pages to generate the accumulated soft read associated with the bits stored in the cell.

* * * * *